United States Patent [19]

Kokubu

[11] Patent Number: 5,710,421
[45] Date of Patent: Jan. 20, 1998

[54] IC CARD

[75] Inventor: Sadao Kokubu, Niwa, Japan

[73] Assignee: Tokai-Rika-Denki-Seisakusho Kabushiki Kaisha, Aichi-Ken, Japan

[21] Appl. No.: 620,538

[22] Filed: Mar. 25, 1996

[30] Foreign Application Priority Data

Mar. 31, 1995 [JP] Japan ..................... 7-076429

[51] Int. Cl.$^6$ ..................... G06K 05/00; G06K 19/06
[52] U.S. Cl. ..................... 235/492; 235/380
[58] Field of Search ..................... 235/492, 487, 235/375, 380, 383, 382, 384, 385

[56] References Cited

U.S. PATENT DOCUMENTS 4,849,611  7/1989  Ueda ..................... 239/492
5,004,899  4/1991  Ueda ..................... 239/492

Primary Examiner—Donald T. Hajec
Assistant Examiner—Thien Minh Le
Attorney, Agent, or Firm—Oliff & Berridge

[57] ABSTRACT

A card body of an IC card is composed of first and second halves connected by a self hinge portion so as to be foldable into halves in such a manner that the surface where a contact is provided comes inside. The first and second halves are provided with a magnet and a magnetic body to hold the IC card folded by magnetic attractive force. When folded, a control section provided in the first half 1a is connected to transmitting-receiving means and a communication control section that are provided in the second half, by the contact and the transmission-reception contact, so that the IC card can function as a non-contact type IC card.

15 Claims, 3 Drawing Sheets

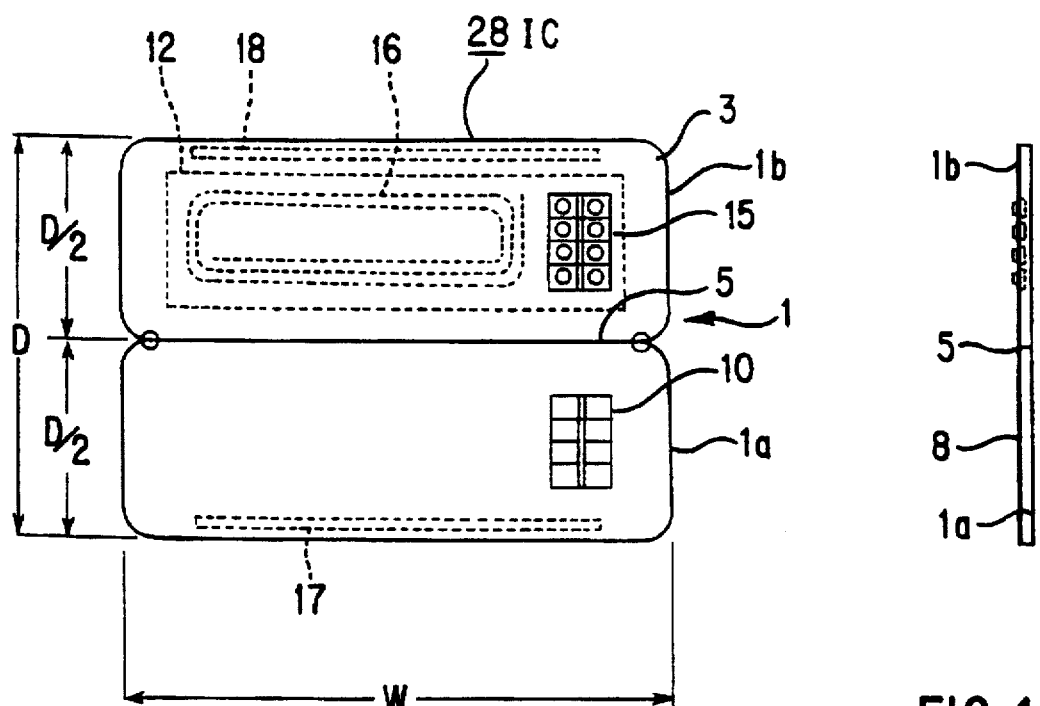
FIG. 1(b)
FIG. 1(a)
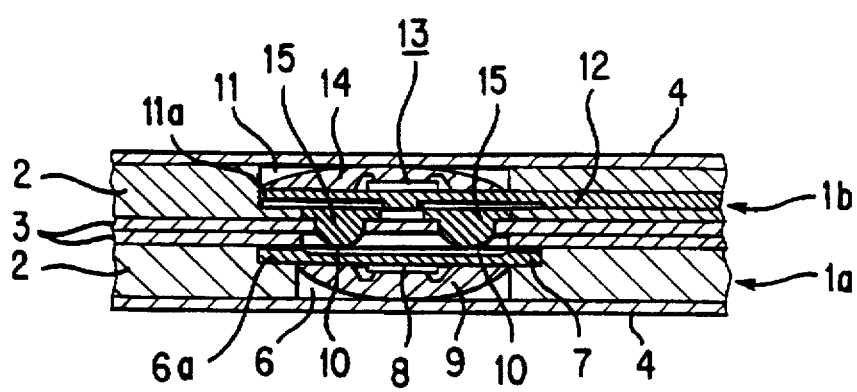
FIG. 2

IC CARD

BACKGROUND OF THE INVENTION

1. Field of the Invention

The present invention relates to an IC card for transmitting data to and receiving data from an external device via contacts.

2. Description of the Related Art

IC cards are used as, for example, cash dispensing cards or credit cards. Typical IC cards are of contact type in which exposed contacts are provided in a surface of the card body. By directly contacting the contact of such an IC card with the contact of a terminal (external device) connected to a host computer, data communication therebetween can be performed. The contact type IC cards have advantages in that they can be provided with simple constructions and low costs.

However, since the contact of a contact type IC card is exposed all the time, the surface of the contact is likely to oxidize or become dirty with dust or dirt from hands. Thus, the contact type IC cards have problems with possible deterioration of the reliability of good contact with the contact of a terminal or low durability. Furthermore, since the size of IC cards is standardized, the card body is rather large compared with the IC part and thus inconvenient to carry.

SUMMARY OF THE INVENTION

The present invention is intended to solve the above-stated problems. An object of the invention is to provide an IC card which can protect the contacts provided in a surface of the card body and which enables the card body to be reduced in size for the carrying of the IC card.

To achieve the above-stated object, according to the present invention, there is provided an IC card comprising: a card body; a contact provided in a surface of the card body; storing means for storing various data; and control means for transmitting data to and receiving data from an external device via the contact and for writing into or reading from the storing means the data to be transmitted or received, the card body comprising a hinge portion which allows the card body to be folded substantially into halves in such a manner that the surface provided with the contact comes inside.

Preferably, the IC card comprises holding means for holding the card body folded in substantially halves.

It is also preferred that, of the substantial halves of the foldable card body, a first half be provided with the contact, the storing means and the control means, and that a second half be provided with: transmitting-receiving means for transmitting various data to or receiving various data from the external device by using an air-propagating signal; a transmission-reception contact provided so as to contact said contact when the card body is folded substantially in halves; and communication control means for achieving data transmission and reception between the control means and the transmitting-receiving means via the transmission-reception contact.

The card body of the invention has a hinge portion and can be folded into halves in such a manner that the surface provided with the contact comes inside. Therefore, the surface of the contact can be protected, and the size reduction of the card body to half makes the IC card easy to carry.

In a preferred construction of the invention, since the IC card has holding means for holding the card body folded substantially in halves, the card body will not unfold when the IC card is carried, thus further facilitating the carrying of the IC card.

In a further preferred construction, when the card body is folded substantially into halves, the contact and the transmission-reception contact will be electrically connected to enable the data transmission and reception between the control means provided in the first half and the communication control means provided in the second half. In addition, the transmitting-receiving means provided in the second half enables the non-contact data transmission and reception in conjunction with an external device.

BRIEF DESCRIPTION OF THE DRAWINGS

The foregoing and further objects, features and advantages of the present invention will become apparent from the following description of preferred embodiments with reference to the accompanying drawings, wherein:

FIG. 1A and 1B are plan and side views of the overall construction of a first embodiment of the IC card of the invention;

FIG. 2 is a sectional view of substantially essential portions of the first embodiment, illustrating how the contacts make contact when the IC card is folded in halves;

DETAILED DESCRIPTION OF PREFERRED EMBODIMENTS

Figure 3:
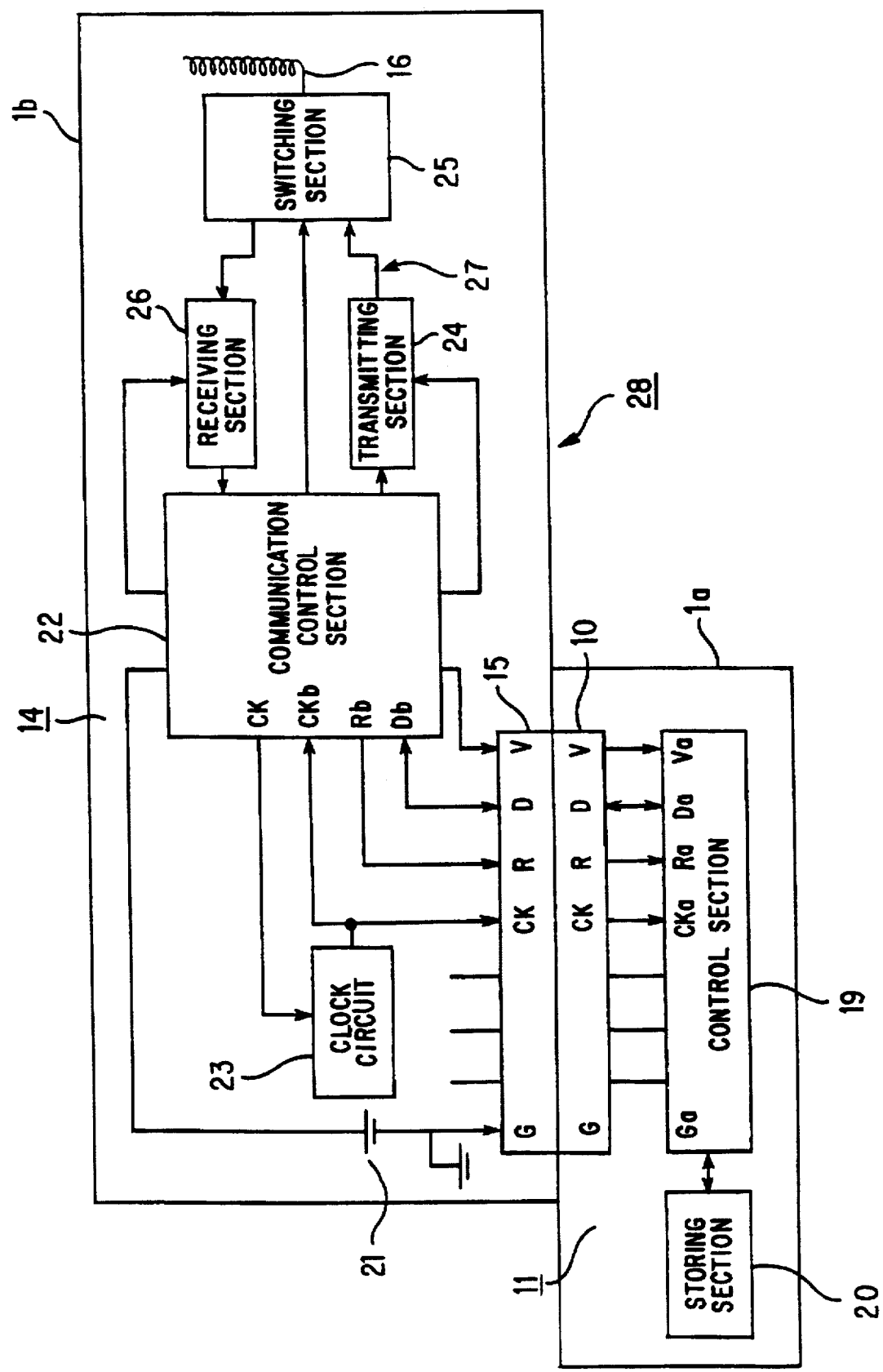
FIG. 3 is a block diagram of the electrical construction of the first embodiment.

A first embodiment of the present invention will be described with reference to FIGS. 1 to 3.

Referring to FIGS. 1 and 2, a card body 1 is formed by adhering synthetic resin sheets 3, 4 to the obverse and reverse surfaces of a synthetic resin card base 2. A self hinge portion 5 serving as a hinge portion and is formed in a central portion of the card body 1, dividing the card body 1 into a first half 1a and a second half 1b. The self hinge portion 5 is unitary with the first and second halves 1a, 1b. The self hinge portion 5 allows the card body 1 to be folded into halves so that the obverse surfaces of the first and second halves 1a, 1b face each other. The card body 1 has a normal size according to the standard. The longitudinal dimension of the card body 1 is D, and the lateral dimension is W. The halves 1a, 1b of the card body 1 have a longitudinal dimension of the D/2 and a lateral dimension of W.

An end portion of the card base 2 in the first half 1a is provided with a rectangular through hole 6 having a step 6a on which a printed board 7 is mounted. The printed board 7 is packaged with an IC chip (bare chip) 8 fixed to the reverse surface thereof by adhesion. The IC chip 8 is electrically connected by wire bonding to a wiring pattern formed of copper foil or the like (not shown) on the reverse surface of the printed board 7. Insulation is achieved by an insulation layer 9 formed of a resin molding on the reverse side of the printed board 7.

A flat plate-shaped contact 10 having eight contact points is provided in the obverse surface of the printed board 7. The contact 10 is electrically connected to the copper foil wiring pattern. The sheet 3 has an opening formed in an portion thereof corresponding to the contact 10 so that the contact 10 is exposed.

An end portion of the card base 2 in the second half 1b is provided with a rectangular through hole 11 having a step 11a. A printed board 12 is embedded in the card base 2 in such a manner that an end portion of the printed board 12 faces the through hole 11 and abuts the step 11a. The printed circuit board 12 is packaged with an IC chip 13 mounted on the reverse surface (the upper surface in FIG. 2) of the end portion of the printed circuit board 12. The IC chip 13 is covered with an insulation layer 14. A projected transmission-reception contact 15 having eight contact points and formed of an electrically conductive Ag compound rubber is mounted on the obverse surface (the lower surface in FIG. 2) of the end portion of the printed board 12. Tip portions of the transmission-reception contact 15 extend through and protrude from the sheet 3.

When the card body 1 is folded so that the first and second halves 1a, 1b face each other as shown in FIG. 2, the projected transmission-reception contact 15 and the contact 10 are electrically connected with the tip portions of the projected transmission-reception contact 15 contacting the surface of the contact 10 while being elastically deformed.

A rectangular loop antenna coil 16 is formed by patterning a conductive material in the portion of the printed board 12 of the second half 1b other than the aforementioned end portion. A long magnet 17 serving as holding means is embedded in the first half 1a of the card body 1, extending parallel with a side end of the first half 1a remote from the self hinge portion 5. A long magnetic body 18 serving as holding means and formed of a magnetic metal is embedded in the second half 1b, extending parallel with a side end of the second half 1b remote from the self hinge portion 5. When the card body 1 is folded into halves, the magnetic body 18 is attracted to the magnet 17, thus holding the card body 1 folded.

FIG. 3 illustrates the electrical construction of the IC chips 8, 13 of the first and second halves 1a, 1b, indicating various functions by separate blocks.

In the first half 1a, a ground input terminal Ga of a control section (control means) 19 including a CPU, etc., is connected to a terminal G of the contact 10. A power input terminal Va of the control section 19 is connected to a terminal V of the contact 10. A clock input terminal CKa, a reset input terminal Ra and a data input-output terminal Da of the control section 19 are connected to terminals CK, R and D of the contact 10, respectively. The control section 19 is connected to a storing section (storing means) 20 constituted by, for example, EEPROM, by address and data bus lines and a control signal line.

In the second half 1b, the positive pole of a battery 21 is connected to a power input terminal Vb of a communication control section (communication control means) 22 including a CPU, etc., and the negative pole of the battery 21 is connected to a terminal G of the transmission-reception contact 15. A power output terminal Vo of the communication control section 22 is connected to terminal V of the transmission-reception contact 15. The power output terminal Vo selectively supplies power to the power input terminal Va of the control section 19 via the transmission-reception contact 15 and the contact 10. A reset signal output terminal Rb and a data input-output terminal Db of the communication control section 22 are connected to terminals R and D of the transmission-reception contact 15, respectively. The communication control section 22 supplies a control signal from a clock control terminal Cc to a clock circuit 23 to control the output of clock signal.

A clock signal output terminal of the clock circuit 23 is connected to a terminal CK of the transmission-reception contact 15 so that a clock signal can be supplied to the clock signal input terminal CKa of the control section 19. Further, since the clock signal from the clock circuit 23 is also used as a synchronizing signal for data transmission and reception between the control section 19 and the communication control section 22, the clock signal output terminal of the clock circuit 23 is also connected to the clock signal input terminal CKb of the communication control section 22.

The communication control section 22 supplies a data input terminal of a transmitting section 24 with data to be transmitted and also supplies the transmitting section 24 with a control signal so as to control modulation of the data to be transmitted. The transmitting section 24 supplies a transmission signal to the antenna coil 16 via a switching section 25. The switching section 25 supplies the signal received by the antenna coil 16 to a receiving section 26. A data output terminal of the receiving section 26 is connected to a received-data input terminal of the communication control section 22.

The communication control section 22 supplies a control signal to the receiving section 26 to control demodulation of received signals. The communication control section 22 also supplies the switching section 25 with a switching signal for switching data transmission and reception via the antenna coil 16. The switching signal is normally in a reception status and is made into a transmission status only when the communication control section 22 is to perform transmission. The antenna coil 16, the transmitting section 24, the switching section 25 and the receiving section 26 constitute transmitting-receiving means 27. The IC card 28 is constructed as described above.

The operation of the first embodiment will be described. When the first and second halves 1a, 1b of the IC card 28 are unfolded to form an angle of 18° therebetween, the IC card 28 functions as a contact type IC card. More specifically, when the thus-unfolded IC card 28 is inserted into a terminal (external device, not shown), the contact 10 is electrically connected to a contact provided in the terminal so that power, a reset signal and a clock signal are supplied to the power input terminal Va, the reset signal input terminal Ra and the clock signal input terminal CKa of the control section 19, respectively, via the corresponding terminals of the contact 10.

Then, when the reset signal is canceled, the control section 19 is started. The control section 19 first reads out an ID code specifically assigned to the IC card 28 from the storing section 20, and converts the ID code into serial data, and then transmits the serial data to the terminal via the contact 10 and the contact of the terminal. Upon receiving the ID code of the IC card 28, the terminal performs predetermined operation and then, in accordance with the operation, transmits to the control section 19 a read-out or write-in command signal in the form of serial data. The control section 19 reads out data from the storing section 20 in accordance with the command signal, and then converts the data into serial data or writes in the storing section 20 the serial data transmitted from the terminal.

On the other hand, when the IC card 28 is folded into halves so that the surface thereof in which the contact 10 is provided comes inside, the exterior size of the IC card 28 becomes D/2 in longitudinal dimension and W in lateral dimension, and the magnet 17 provided in the first half 1a and the magnetic body 18 provided in the second half 1b are attracted to each other by magnetic force. When the IC card 28 is thus folded, the control section 19 of the first half 1a is connected to the transmitting-receiving means 27 and the communication control section 22 provided in the second half 1b, by the contact 10 and the transmission-reception contact 15. Thus, the IC card 28 functions as a non-contact type IC card.

In this case, the communication control section 22 intermittently supplies a control signal to the receiving section 26 so that the receiving section 26 intermittently performs reception (demodulation), in order to limit the power consumption of the battery 21. A non-contact type terminal (external device, not shown) intermittently transmits to the IC card 28 a question signal in the form of an electromagnetic signal, that is, an air-propagating signal. When the IC card 28 enters the reception area of the question signal, that is, the antenna coil 16 electromagnetically couples with a transmission antenna coil of the terminal, so that the antenna coil 16 receives the question signal, the question signal is then supplied to the receiving section 26 via the switching section 25.

When the receiving section 26 demodulates the received signal during intermittent reception, the receiving section 26 outputs to the communication control section 22 the received data of the demodulated question signal in the form of serial data. Upon receiving the question signal, the communication control section 22 outputs power to the power output terminal Vo and supplies a control signal to the clock circuit 23 so that the clock circuit 23 outputs a clock signal, and the communication control section 22 then supplies the power and the clock signal to the control section 19. When a predetermined length of time subsequently elapses, the communication control section 22 cancels the reset signal to start the control section 19.

When started, the control section 19 reads the IC code of the IC card 28 from the storing section 20, and converts the IC code into serial data, and then transmits the serial data to the communication control section 22 via the terminals D of the contact 10 and the transmission-reception contact 15, as described above. The communication control section 22 then supplies a control data and the ID data to the transmitting section 24 to start the transmission section 24 modulating.

After modulating the ID data into, for example, FM (frequency modulation) signal, the transmitting section 24 transmits the modulated signal to the antenna coil 16 via the switching section 25. The antenna coil 16 then transmits the modulated signal to the terminal. Upon receiving the ID code of the IC card 28, the terminal performs a predetermined operation and then, in accordance with the operation, conducts transmission and reception as described above so that data stored in the storing section 20 is read out or rewritten.

According to this embodiment, since the card body 1 of the IC card 28 is generally composed of the first and second halves 1a, 1b interconnected by the self hinge portion 5 so as to be foldable in such a manner that the surface in which the contact 10 is provided comes inside, the surface of the contact 10 can be protected from oxidation or staining with dust or the like. In addition, the size reduction of the IC card 28 into half make the IC card 28 easy to carry.

Furthermore, according to the embodiment, since the halves 1a, 1b are provided with the magnet 17 and the magnetic body 18 to hold the IC card folded in halves by magnetic attraction, the halves 1a, 1b will not unfold when the IC card 28 is folded and carried, thus further facilitating the carrying of the IC card 28.

Further, according to the embodiment, when the IC card 28 is folded in halves, the control section 19 of the first half 1a is connected to the transmitting-receiving means 27 and the communication control section 22 provided in the second half 1b, by the contact 10 and the transmission-reception contact 15, so that the IC card 28 can function as a non-contact IC card. Therefore, even in an IC card system comprising contact type terminals and non-contact type terminals, the IC card 28 can be used with both type and eliminates the need to use two different kinds of IC cards corresponding to the individual types.

Figure 4:
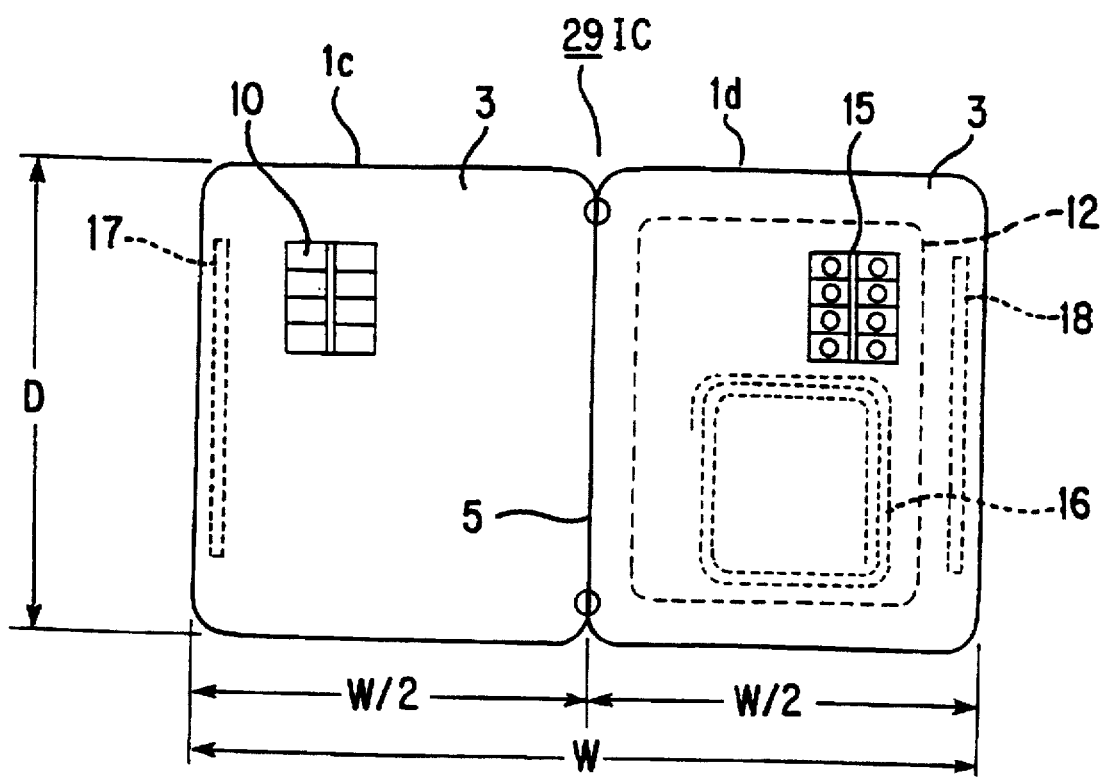
FIG. 4 illustrates a second embodiment of the invention.

While according to the first embodiment, the first and second halves 1a, 1b are designed to have a longitudinal dimension of D/2 and a lateral dimension of W to make the card body 1 foldable with respect to a lateral folding line, an IC card 29 may be composed, as shown as a second embodiment of the invention in FIG. 4, of first and second halves 1c, 1d each having a longitudinal dimension D and a lateral dimension W/2 so as to make the card body 1 foldable with respect to a longitudinal folding line. According to the second embodiment, the first half 1a is provided with the elements provided in the first half 1a according to the first embodiment, and the second half 1c is provided with the elements provided in the second half 1b according to the first embodiment.

The present invention is not limited to the embodiments described above and illustrated in the drawings, but may be modified as follows.

The material of the magnetic body 18 is not limited to a magnetic metal but may be a magnetic rubber or a magnetic resin. In addition, the magnetic body 18 may be replaced by a magnet disposed so as to face the magnet 17 in opposite polarity arrangement. Furthermore, the holding means is not limited to the magnet 17 and the magnetic body 18. For example, the holding means may also be achieved by providing a protrusion and a recess or hole in the surfaces of the first and second halves 1a, 1b so as to be engageable with each other.

The self hinge portion 5 may be replaced by a separate hinge part by providing sheets 3 separately for the first half 1a and the second half 1 and connecting the separate hinge part to end portions of the abutting upper and lower ends of the halves 1a and 1b.

The transmission and reception between the transmitting-receiving means 27 and a terminal can be achieved by not only FM signals but also AM signals or PNM signals. In addition, microwaves, electrostatic signals or light may also be used as the air-propagating signals if the construction is suitably modified.

While the present invention has been described with reference to what are presently considered to be preferred embodiments thereof, it is to be understood that the invention is not limited to the disclosed embodiments. To the contrary, the invention is intended to cover various modifications and equivalent arrangements included within the spirit and scope of the appended claims.

What is claimed is:

1. An IC card comprising:

a card body;

a contact provided in a surface of the card body;

sorting means for storing various data; and control means for transmitting data to and receiving data from an external device via the contact and for writing into or reading from the storing means the data to be transmitted or received, the card body comprising a hinge portion which allows the card body to be folded substantially into halves in such a manner that the surface provided with the contact comes inside, wherein, of the substantial halves of the foldable card body, a first half is provided with the contact, the storing means and the control means, and wherein a second half is provided with:

transmitting-receiving means for transmitting various data to or receiving various data from the external device by using an air-propagating signal;

a transmission-reception contact provided so as to contact said contact when the card body is folded substantially in halves; and communication control means for achieving data transmission and reception between the control means and the transmitting-receiving means via the transmission-reception contact.

2. An IC card according to claim 1, further comprising holding means for holding the card body folded substantially in halves.

3. The IC card according to claim 2, wherein the holding means comprises a magnet.

4. The IC card according to claim 2, wherein the hinge portion is formed in a central portion of the card body dividing the card body into a first half and a second half, which comprise the halves when folded, and the holding means comprises a magnet disposed in the first half and a magnetic body disposed in the second half.

5. The IC card according to claim 2, wherein the magnetic body is disposed in the first half adjacent and extending parallel with a side of the first half remote from the hinge portion and the magnet is disposed in the second half adjacent and extending parallel with a side of the second half remote from the hinge portion.

6. The IC card according to claim 2, wherein the hinge portion is formed in a central portion of the card body dividing the card body into a first half and a second half, which comprise the halves when folded, and the holding means comprises a protrusion disposed in the first half and a recess in the second half.

7. The IC card according to claim 2, wherein the hinge portion is formed in a central portion of the card body dividing the card body into a first half and a second half, which comprise the halves when folded, and the holding means comprises a first magnet disposed in the first half and a second magnet arranged to face the first magnet in opposite polarity disposed in the second half.

8. The IC card according to claim 1, wherein the card body comprises a card base, a first sheet adhered to the surface of the card body provided with the contact and a second sheet adhered to a surface opposite to the surface provided with the contact.

9. The IC card according to claim 8, wherein the card body and the first and second sheets are formed of a synthetic resin.

10. The IC card according to claim 8, wherein the first sheet has a first opening formed in a portion thereof corresponding to a position of the contact and a second opening formed in a portion thereof corresponding to a position of the transmission-reception contact.

11. The IC card according to claim 1, wherein the hinge portion is formed in a central portion of the card body dividing the card body into the first half and the second half and the hinge portion is unitary with the first half and second half.

12. The IC card according to claim 1, wherein the hinge portion is formed in a central portion of the card body dividing the card body into the first half and the second half, the first half provided with a rectangular through-hole having a step on which a printed board having an IC chip fixed thereto is mounted and the contact provided on a side of the printed board opposite to a side to which the IC chip is fixed, and the second half provided with a rectangular through-hole having a step on which a printed board having an IC chip fixed thereto is mounted and the transmission-reception contact provided on a side of the printed board opposite to a side to which the IC chip is fixed so that when the card body is folded so that the first and second halves face each other, the transmission-reception contact and the contact are electrically connected.

13. A method of converting an IC card from a contact type IC card to a non-contact type IC card and vise versa, the IC card including a card body, a contact provided in a surface of the card body, storing means for storing various data and control means for transmitting data to and receiving data from an external device via the contact and for writing into or reading from the storing means the data to be transmitted or received, the method comprising:

providing the card body with a hinge portion which allows the card body to be folded substantially into halves;

arranging a first half of the foldable card body the contact, the storing means and the control means;

providing in a second half of the foldable card body a transmitting-receiving means for transmitting various data to or receiving various data from the external device by using an air-propagating signal, a transmission-reception contact and communication control means for achieving data transmission and reception between the control means and the transmitting-receiving means via the transmission-reception contact; and converting the IC card from a contact type IC card to a non-contact type IC card by folding the card body in such a manner that the surface provided with the contact comes inside and then converting the IC card back to a contact type IC card by unfolding the card body.

14. The method of claim 13, wherein the step of converting the IC card from a contact type IC card to a non-contact IC card comprises:

electrically connecting the transmission-reception contact and the contact.

15. The method of claim 13, wherein the step of converting the IC card from a contact type IC card to a non-contact IC card comprises:

electrically connecting the communication control means and the transmitting-receiving means to the control means via electrical connection of the transmission-reception contact and the contact.

* * * * *